United States Patent [19]

Gentry et al.

[11] Patent Number: 5,568,629

[45] Date of Patent: Oct. 22, 1996

[54] METHOD FOR PARTITIONING DISK DRIVES WITHIN A PHYSICAL DISK ARRAY AND SELECTIVELY ASSIGNING DISK DRIVE PARTITIONS INTO A LOGICAL DISK ARRAY

[75] Inventors: Timothy W. Gentry; Gerald J. Fredin, both of Wichita, Kans.; Daniel A. Riedl, Andover, Kans.

[73] Assignees: AT&T Global Information Solutions Company, Dayton, Ohio; Hyundai Electronics America, San Jose, Calif.; Symbios Logic, Fort Collins, Colo.

[21] Appl. No.: 148,031

[22] Filed: Nov. 4, 1993

Related U.S. Application Data

[63] Continuation of Ser. No. 812,339, Dec. 23, 1991, abandoned.

[51] Int. Cl.$^6$ .................................................. G06F 12/00
[52] U.S. Cl. ........................................ 395/441; 395/497.04
[58] Field of Search ............................. 364/200 MS File, 364/900 MS File; 395/400, 425, 575, 438–441, 497.01–, 497.04

[56] References Cited

U.S. PATENT DOCUMENTS

| | | | |
|---|---|---|---|
| 4,811,278 | 3/1989 | Bean et al. | 364/900 |
| 4,837,675 | 6/1989 | Bean et al. | 364/200 |
| 4,870,643 | 9/1989 | Bultman et al. | 371/11.1 |
| 5,077,736 | 12/1991 | Dunphy, Jr. et al. | 371/10.1 |
| 5,088,081 | 2/1992 | Farr | 369/54 |
| 5,124,987 | 6/1992 | Milligan et al. | 371/10.1 |
| 5,128,810 | 7/1990 | Halford | 360/39 |

(List continued on next page.)

OTHER PUBLICATIONS

Varhol, Gigabytes online: disk arrays offer high performance, storage gains, & data integrity, Personal Workstation, vol. 3, No. 6, p. 44 (5). Jun. 1991.

Devlin et al., Products, PC Week, vol. 6, No. 5, p. 91 (5). Feb. 6, 1989.

Manuel, Breaking the data–rate logjam with arrays of small disk drives, Electronics, vol. 62, No. 2, p. 97 (4). Feb. 1989.

"A Case for Redundant Arrays of Inexpensive Disks (RAID),"0 by David A. Patterson et al Computer Science Division (EECS) University of California, Report No. UCB/CSD 87/391, Dec. 1987, pp. 1–24.

*Primary Examiner*—Matthew M. Kim
*Attorney, Agent, or Firm*—Wayne P. Bailey; James M. Stover

[57] ABSTRACT

A method for partitioning a disk array into logical storage units distinct from the physical storage units within the array. A set of individual drives within the array are partitioned into multiple partitions. Corresponding partitions from the individual drives are grouped together to form a logical unit which is addressed as, and functions as, an independent disk array. The partitions within the logical unit are addressed as, and function as, disk drives within the logical array. Thus, a single set of disk drives may be divided into two or more logical storage units, each functioning as an independent disk array, and each employing a different RAID level scheme for storing data. Alternatively, multiple sets of disk drives within the array can combined together into a logical storage unit which functions as a single set of drives. Corresponding drives from each set of drives are addressed as a single disk drive within the logical unit. Thus a logical unit is formed having twice or more the capacity of a single set of disk drives. Finally, The two logical disk arrays described above may be utilized together to organize a plurality of disk drives into several logical arrays, some formed from partitions of disk drives, some from combining groups of unpartitioned disk drives, and others formed from combining unpartitioned drives together with partitions of drives. Each logical array may employ a different scheme for storing data.

8 Claims, 8 Drawing Sheets

U.S. PATENT DOCUMENTS

| | | | |
|---|---|---|---|
| 5,140,592 | 8/1992 | Idleman et al. | 371/8.1 |
| 5,148,432 | 9/1992 | Gordon et al. | 371/10.1 |
| 5,166,939 | 11/1992 | Jaffe et al. | 371/40.1 |
| 5,195,100 | 3/1993 | Katz et al. | 371/66 |
| 5,206,943 | 4/1993 | Callison et al. | 395/425 |
| 5,210,866 | 5/1993 | Milligan et al. | 395/575 |
| 5,218,689 | 6/1993 | Holte et al. | 395/411 |
| 5,239,659 | 8/1993 | Rudeseal et al. | 395/800 |
| 5,274,645 | 12/1993 | Idleman et al. | 395/182.04 |
| 5,301,297 | 4/1994 | Menon et al. | 395/425 |
| 5,303,244 | 4/1994 | Watson | 371/10.1 |
| 5,317,728 | 5/1994 | Tevis et al. | 395/600 |
| 5,345,565 | 9/1994 | Jibbe et al. | 395/325 |
| 5,469,453 | 11/1995 | Glider et al. | 371/68.1 |
| 5,475,697 | 12/1995 | Katz et al. | 395/486 |

RAID 1
TRANSPARENT MIRRORING

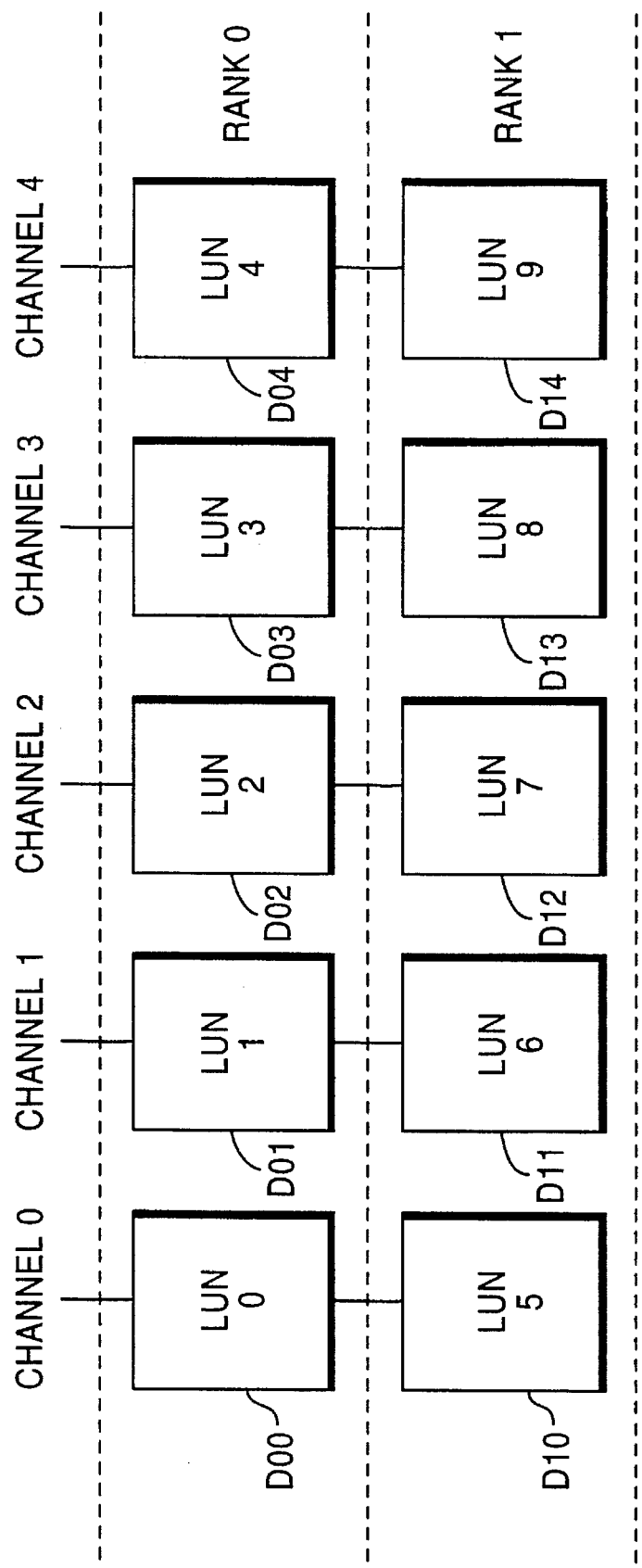
FIG. 8  LUN PER PHYSICAL DISK

METHOD FOR PARTITIONING DISK DRIVES WITHIN A PHYSICAL DISK ARRAY AND SELECTIVELY ASSIGNING DISK DRIVE PARTITIONS INTO A LOGICAL DISK ARRAY

This is a continuation of application Ser. No. 07/812,339, filed on Dec. 23, 1991, now abandoned.

BACKGROUND OF THE INVENTION

The present invention relates to disk storage devices for computer systems and, more particularly, to disk arrays or RAID (Redundant Arrays of Inexpensive Disks) storage systems.

RAID storage systems have emerged as an alternative to large, expensive disk drives for use within present and future computer system architectures. A RAID storage system includes an array of small, inexpensive hard disk drives, such as the 5¼ or 3½ inch disk drives currently used in personal computers and workstations. Although disk array products have been available for several years, significant improvements in the reliability and performance of small disk drives and a decline in the cost of such drives have resulted in the recent enhanced interest in RAID systems.

Numerous disk array design alternatives are possible, incorporating a few to many disk drives. Several array alternatives, each possessing different attributes, benefits and shortcomings, are presented in an article titled "A Case for Redundant Arrays of Inexpensive Disks (RAID)" by David A. Patterson, Garth Gibson and Randy H. Katz; University of California Report No. UCB/CSD 87/391, December 1987. The article, incorporated herein by reference, discusses disk arrays and the improvements in performance, reliability, power consumption and sealability that disk arrays provide in comparison to single large magnetic disks.

RAID level 1, discussed in the article, comprises N disks for storing data and N additional "mirror" disks for storing copies of the information written to the data disks. RAID level 1 write functions require that data be written to two disks, the second "mirror" disk receiving the same information provided to the first disk. When data is read, it can be read from either disk. A RAID level 1 system including four drives is depicted in FIG. 1. The drives are labeled DATA 1, MIRROR 1, DATA 2 and MIRROR 2. The blocks shown below the disk drives illustrate the manner in which data is stored on the disks.

RAID level 1 provides a high level of redundancy, high transaction performance, a minor write penalty and no recovery penalty. Although data availability is very high on RAID level 1 systems, the added expense and loss of available data storage capacity which result from supporting duplicate drives can be improved with RAID level 3 and 5 systems.

RAID level 3 systems comprise one or more groups of N+1 disks. Within each group, N disks are used to store data, and the additional disk is utilized to store parity information. During RAID level 3 write functions, each block of data is divided into N portions for storage among the N data disks. The corresponding parity information is written to a dedicated parity disk. When data is read, all N data disks must be accessed. The parity disk is used to reconstruct information in the event of a disk failure. A RAID level 3 system including five drives is shown in FIG. 2. The disk drives are labeled DATA 1 through DATA 5. Data is striped across disks DATA 1 through DATA 4, each data disk receiving a portion of the data being saved. Parity information, generated through a bit-wise exclusive-OR of the data stored on drives DATA I through DATA 4, is saved on drive DATA 5.

RAID level 3 provides data striping at either the byte or word level, very high data transfer rates and no penalty for write or data recovery operations. RAID level 3 systems provide best overall performance when used for large file transfers such as: decision support imaging, medeling and simulation, intensive graphics and image processing, scientific computing and CAD/CAM applications.

A RAID level 5 system is illustrated in FIG. 3. Level 5 systems are also comprised of one or more groups of N+1 disks. RAID level 5 systems differ from RAID level 3 systems in that data to be saved is divided into larger portions, consisting of one or many blocks of data, for storage among the disks. In addition, although each group contains N+1 disks, each disk includes some blocks for storing data and some blocks for storing parity information, i.e., the parity information is distributed among the N+1 drives rather than saved to a dedicated parity disk drive. RAID level 5 writes require access to at least two disks; however, every write to a group does not require access to the same dedicated parity disk. Each disk includes some blocks for storing parity information. In a similar fashion, read operations typically need only access a single one of the N data disks. As with RAID level 3 systems, the parity data is used to reconstruct information in the event of a disk failure.

RAID level 5 provides data striping by system block size, parity distribution across all drives and improved transaction performance, but carries a significant write penalty. RAID level 5 systems are best utilized for super-computer or transaction processing applications requiring high I/O rates and small block sizes. RAID level 5 systems are ideal for the on-line processing needs of airline and automobile reservation centers, automatic teller and point-of-sale operations, and data base applications.

An additional disk array arrangement, referred to herein as RAID level 0, is depicted in FIG. 4. The array includes N data disks for storing data. Data is striped across the N data disks. The array controller accesses each drive independently, allowing up to N concurrent read or write operations at five different physical locations. This provides transparent load balancing and thus a performance improvement over a single disk drive. There is no parity generation or storage provided with RAID level 0, so there are no data recovery or reconstruction features as are provided with RAID levels 1, 3 and 5.

RAID level 0 provides data striping by system block size, high capacity, high transaction performance and no write penalty, but does not provide data recovery or extended data availability. This RAID level is best utilized for applications which require additional performance, but not the data availability provided by the other RAID levels.

As discussed above, the performance of different computer applications are optimized for different RAID level systems. For example, RAID 1 is best suited for applications requiring high data availability, RAID 3 is best utilized with applications requiring large file transfers, RAID 5 provides optimal performance for applications requiring high I/O rates and small block sizes, and RAID 0 is best suited to applications requiring additional performance, but not the data availability provided by the other RAID levels. Thus for processing systems accommodating multiple applications, an array supporting more than one RAID level concurrently may provide performance benefits over a traditional array configured in conformance with a single RAID level.

A method for partitioning a physical disk array into two or more smaller logical arrays may also be desired as the capacity of small disk drives increase, increasing the capacity of disk arrays beyond operating system or application disk size limitations.

OBJECTS OF THE INVENTION

It is therefore an object of the present invention to provide a new and improved method for partitioning a disk array.

It is another object of the present invention to provide such a method in which a disk array may be configured to support more than one RAID level concurrently.

It is yet another object of the present invention to provide a method for supporting multiple logical units on a single set of disk drives.

It is still a further object of the present invention to provide a method for combining multiple sets of disk drives into a single logical unit.

It is an additional object of the present invention to provide a new and improved method for increasing the capacity of a disk array logical unit.

SUMMARY OF THE INVENTION

There is provided, in accordance with the present invention, a method for partitioning a disk array into logical storage units distinct from the physical storage units within the array. In one form of the invention, individual drives within the array are partitioned into multiple partitions. Partitions from two or more drives are grouped together to form a single logical unit. The logical unit is addressed as, and functions as, an independent disk array. The partitions within the logical unit are addressed, and function as, disk drives within the logical array. Thus, a single set or rank of disk drives may be divided into two or more logical units, each functioning as an independent disk array, and each employing a different RAID level scheme for storing data.

In another embodiment of the invention, the array disk drives are organized into two or more groups, each group including two or more drives. Each group of drives is addressed as a single disk drive within the array. Thus an array is formed having twice or more the capacity of an array of single disk drives.

The two embodiments described above may be utilized together to organize a plurality of disk drives into several logical arrays, some formed from partitions of disk drives, some from combining groups of unpartitioned disk drives, and others formed from combining unpartitioned drives together with partitions of drives. Each logical array may employ a different scheme for storing data.

The above and other objects, features, and advantages of the present invention will become apparent from the following detailed specification when read in conjunction with the accompanying drawings in which applicable reference numerals have been carded forward.

BRIEF DESCRIPTION OF THE DRAWINGS

FIG. 8 illustrates an array of ten drives configured into two ranks wherein each disk drive forms a logical unit in accordance with the present invention.

DETAILED DESCRIPTION OF THE PREFERRED EMBODIMENT

Figure 1:
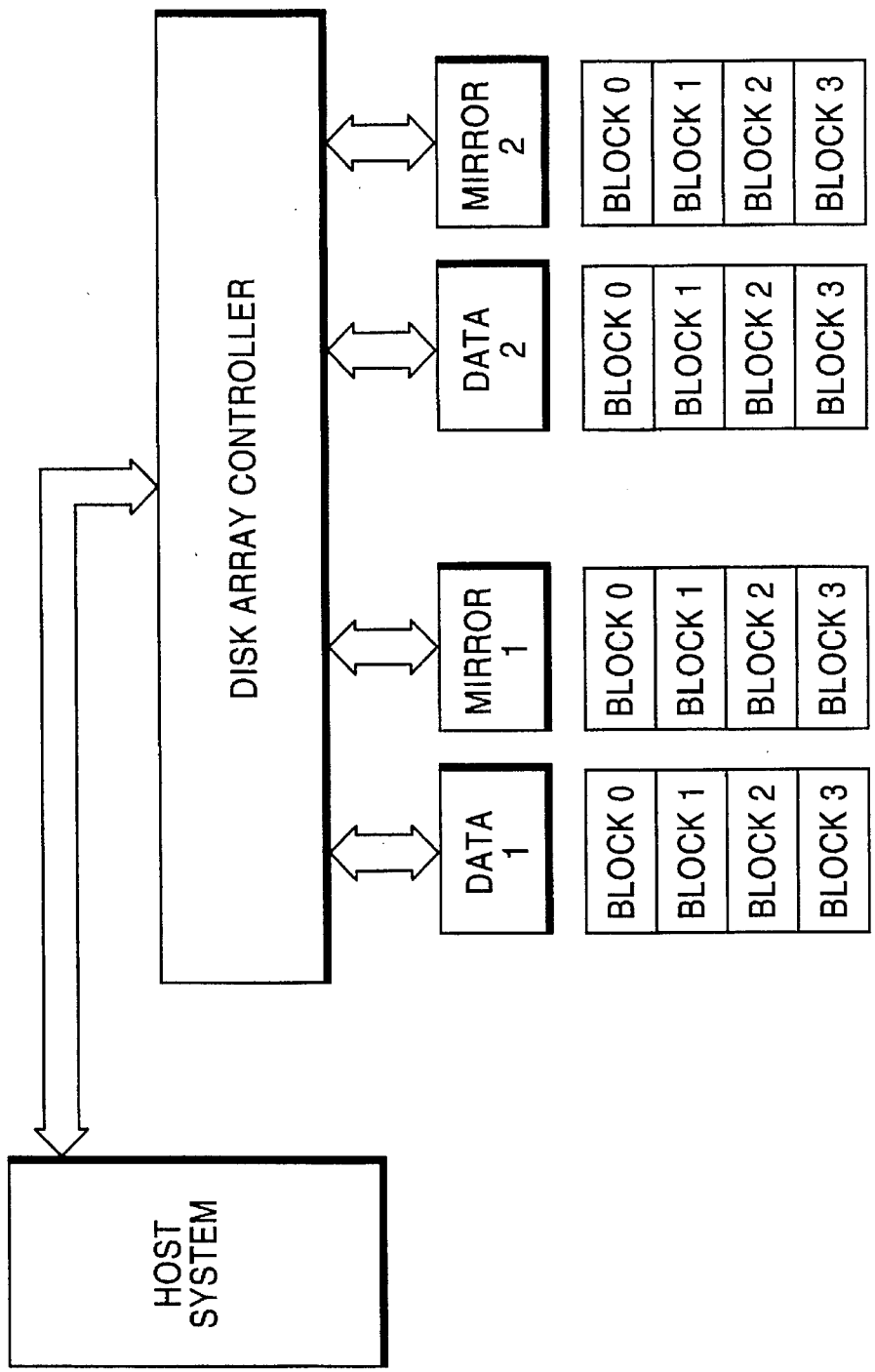
FIG. 1 is a block diagram representation of a RAID level 1 array including two data and two mirror disk drives.
Figure 2:
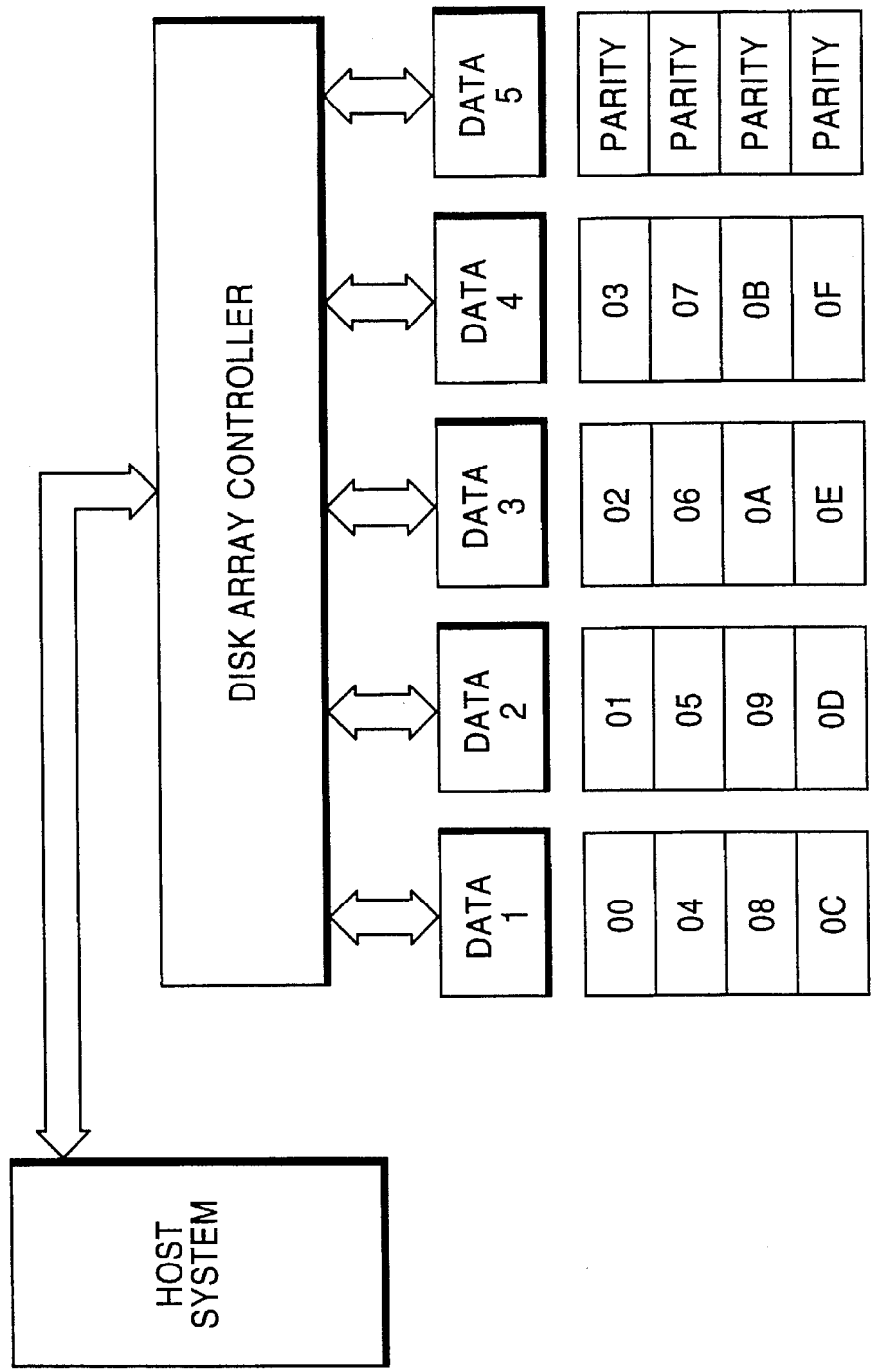
FIG. 2 is a block diagram representation of a RAID level 3 array including four data disk drives and one parity disk drive.
Figure 3:
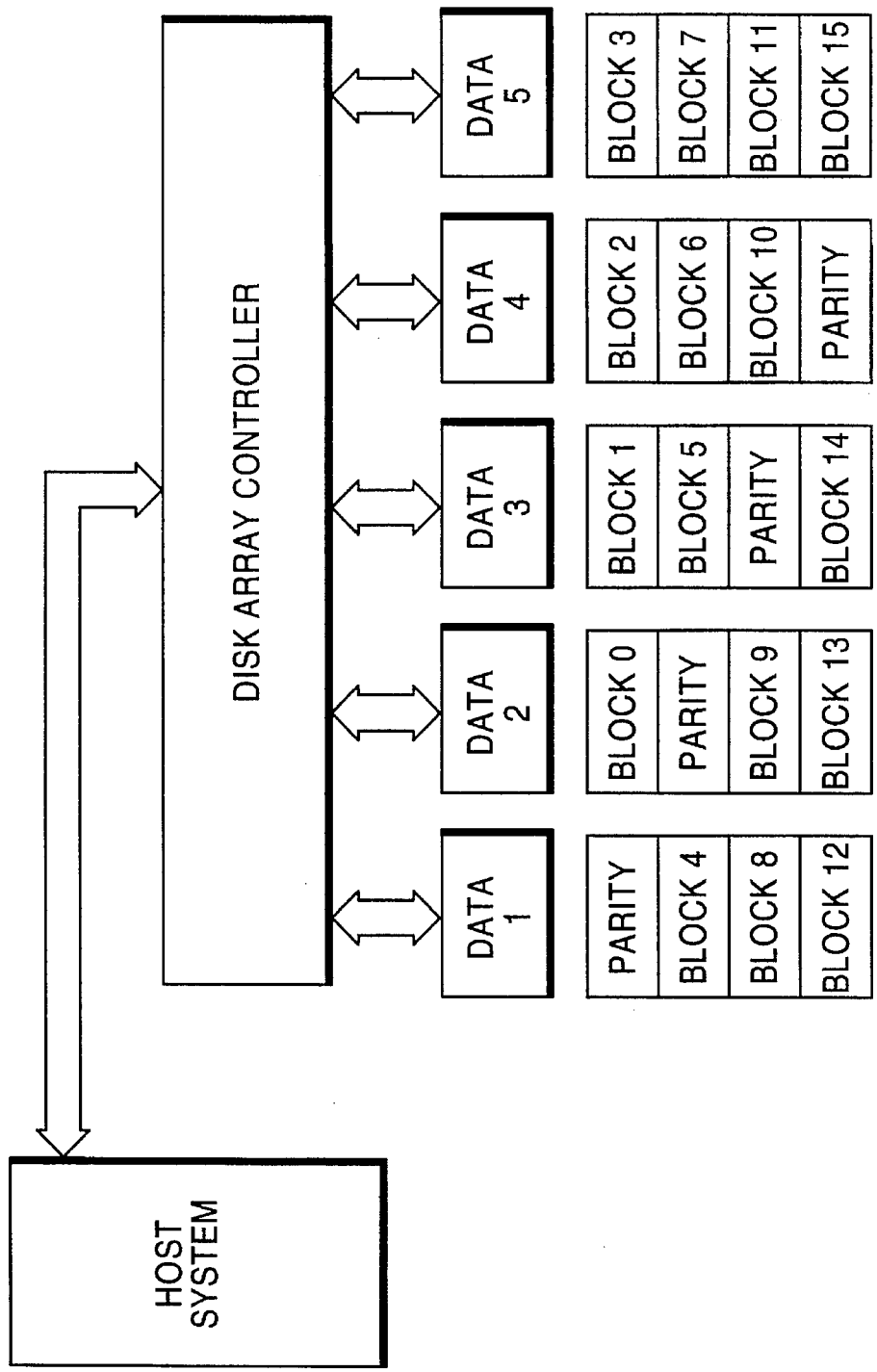
FIG. 3 is a block diagram representation of a RAID level 5 array including five disk drives.
Figure 4:
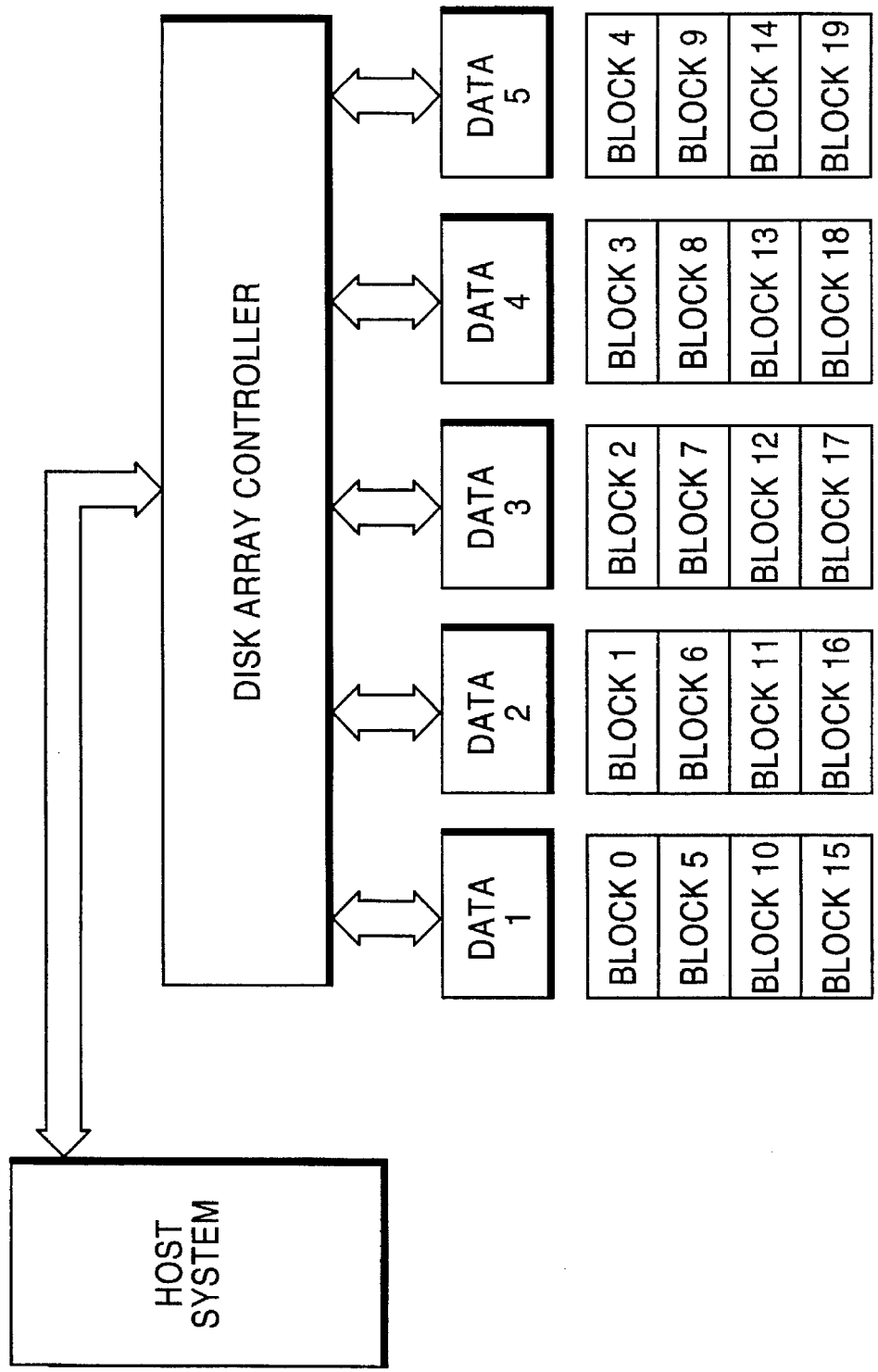
FIG. 4 is a block diagram representation of a RAID level 0 array including five disk drives.
Figure 5:
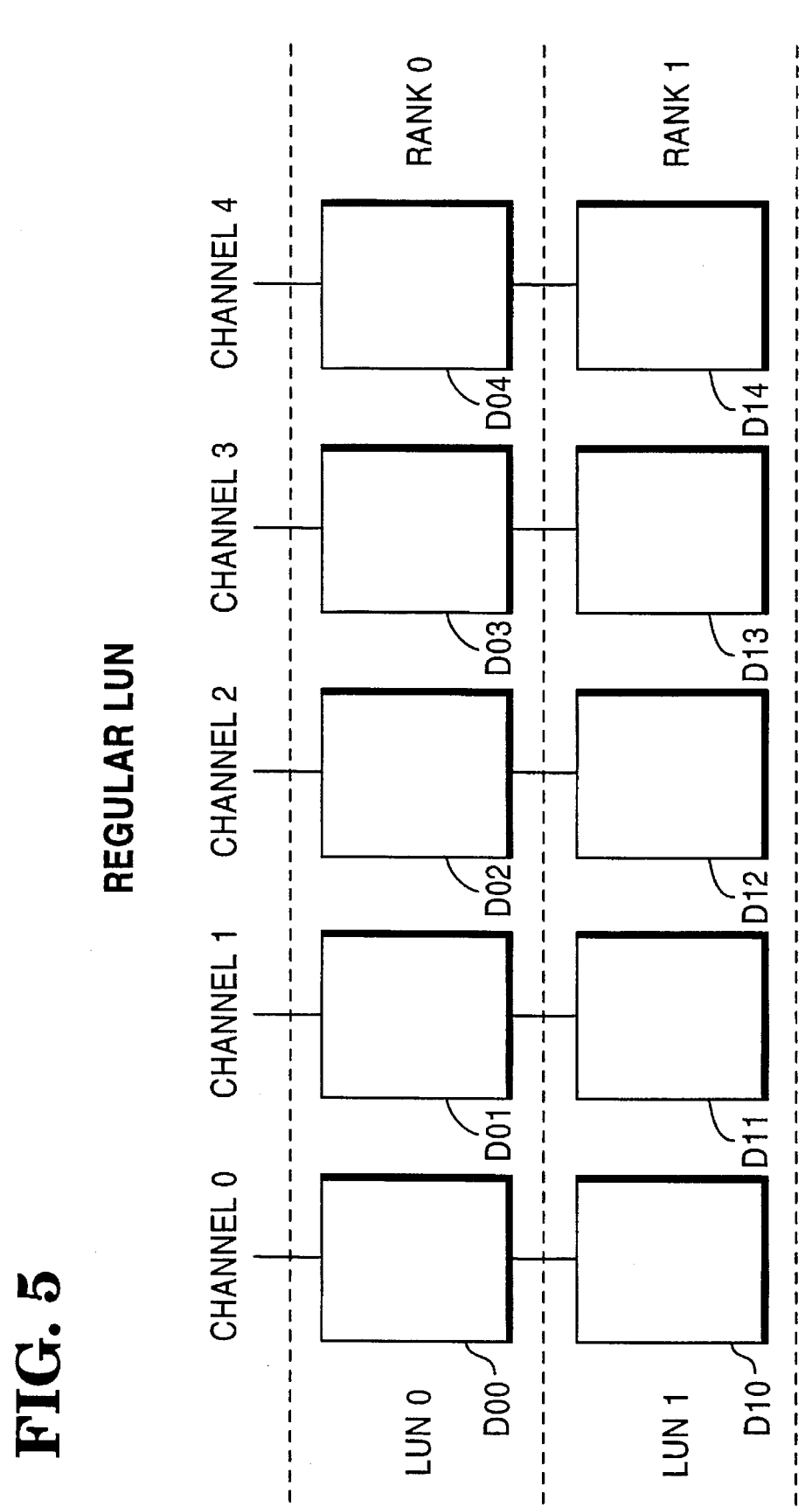
FIG. 5 illustrates an array of ten drives configured into two ranks, each rank consisting of five disk drives. Each rank also forms a logical unit within the array.

Referring now to FIG. 5, there is seen a disk array including ten disk drives identified by reference numerals D00 through D04 and D10 through D14. The ten drives are arranged physically into two groups or ranks, RANK 0 and RANK 1, each rank including five drives. Corresponding drives within the two ranks, such as drives D01 and D11, are accessed through the same bus or channel. Five channels, labeled channel 0 through 4, are shown in FIG. 1.

A disk array logical unit, a portion of the array which is viewed by the system as a single storage device, is typically defined as a set of disk drives across multiple channels or on a single bus. In the array shown in FIG. 5, each one of RANK 0 and RANK 1 comprise a logical unit, also referred to herein as a LUN. The capacity of each LUN is the sum of the individual disk drive capacities less any capacity reserved for parity information. The present invention provides a method for increasing the capacity of a disk array logical unit without the substitution of larger, more expensive disks into the array.

Figure 6:
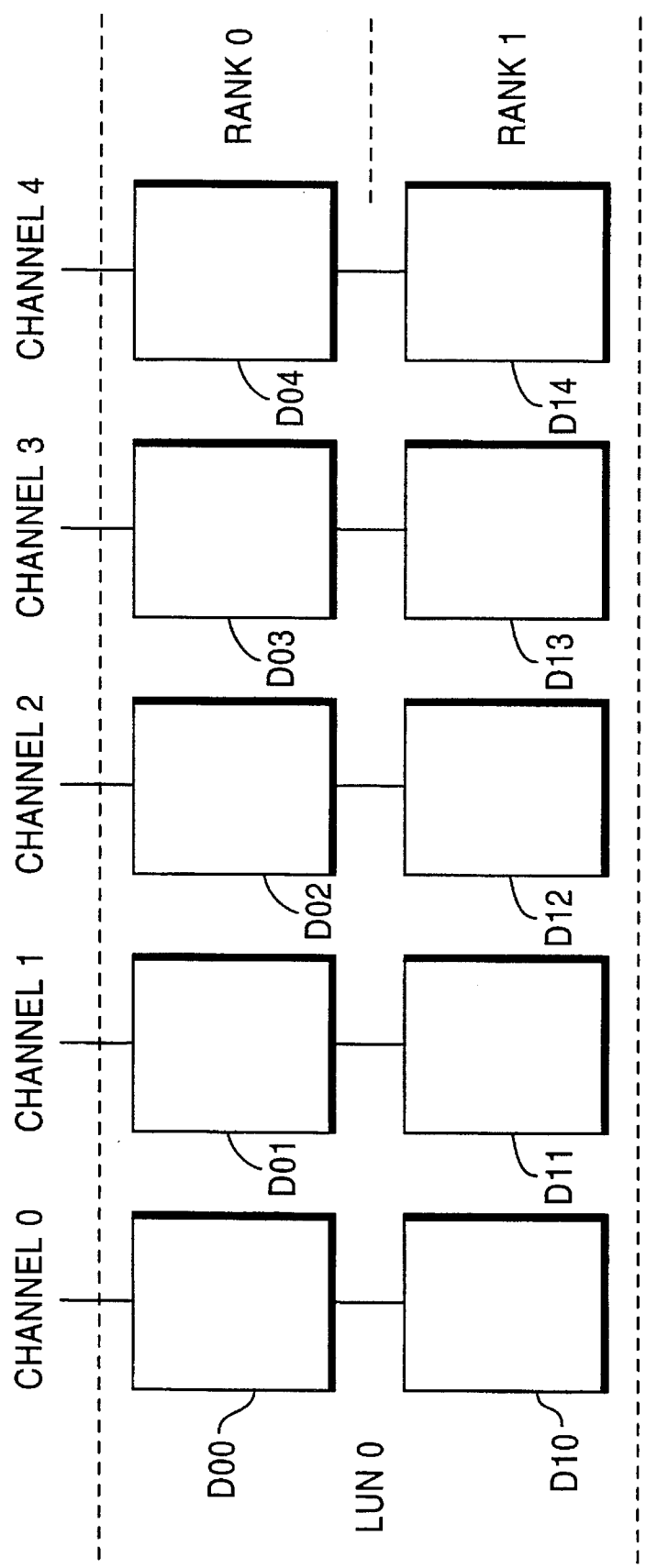
FIG. 6 illustrates an array of ten drives configured into two ranks wherein the ranks are combined into a single logical unit in accordance with one embodiment of the present invention.

FIG. 6 illustrates the array of FIG. 5 configured in accordance with the method of the present invention to form a single logical unit comprised of RANK 0 and RANK 1. The new logical unit, referred to as a super-LUN provides twice the capacity as either of LUN 0 or LUN 1 of FIG. 5. The super-LUN can support any of the RAID levels discussed above, with disk drives residing on the same channel functioning as a single drive within the supported RAID level. Disk drives residing on the same channel may also be managed by the controller as multiple drives, allowing load balancing across all drives.

Figure 7:
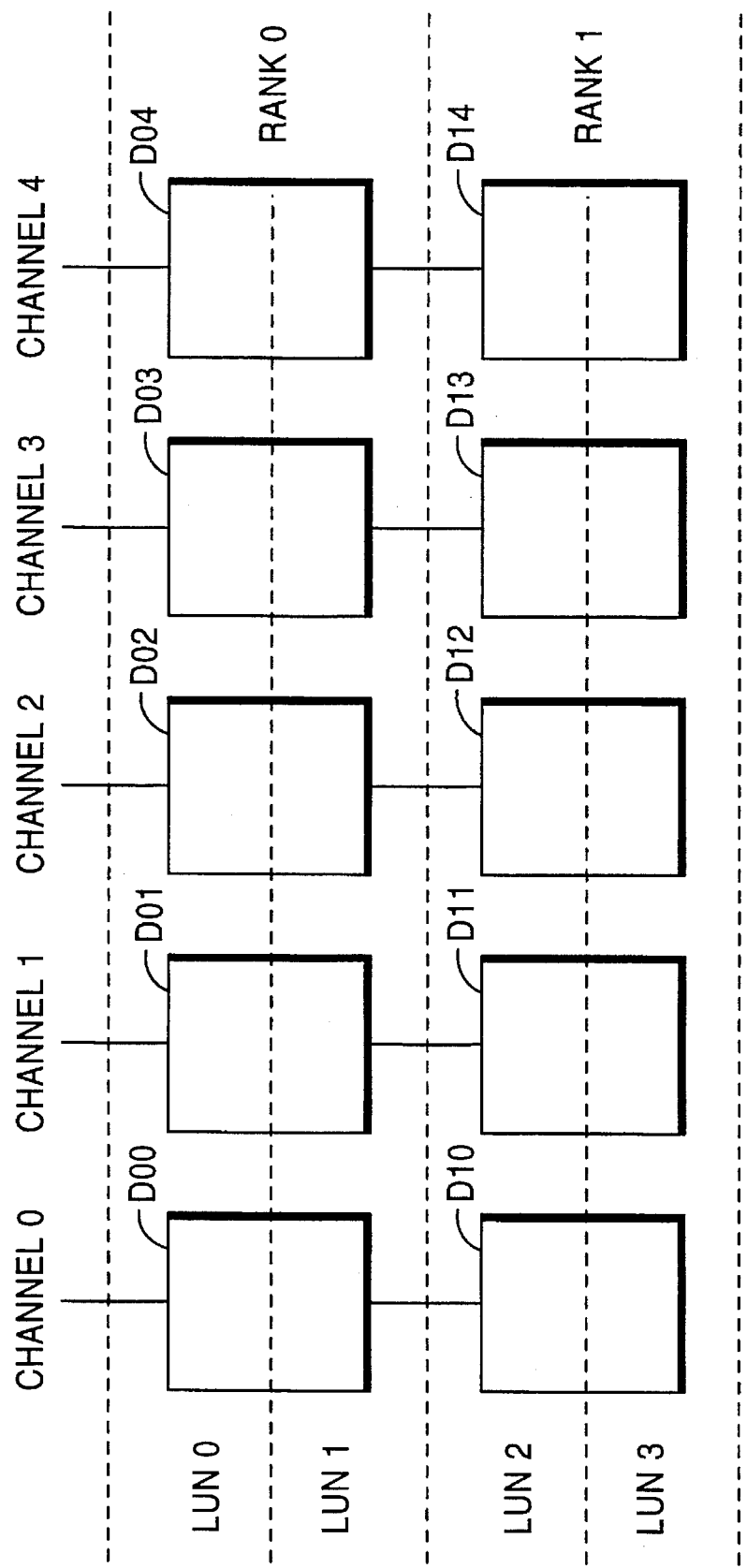
FIG. 7 illustrates an array of ten drives configured into two ranks wherein each rank if divided into two logical units in accordance with the present invention.

FIG. 7 illustrates the array of FIG. 5 configured in accordance with the method of the present invention to form four logical units, labeled LUN 0 through LUN 4, each logical unit commanding a corresponding portion of each disk drive within a rank. The new, smaller, logical units, referred to as sub-LUNs, allow the array controller to operate with operating systems that cannot handle large capacity logical units. Each sub-LUN can support any of the above-described RAID levels. Thus a single rank of drives when divided into two or more logical units can support two or more RAID levels.

FIG. 8 illustrates an additional configuration of the array of FIG. 5 wherein each disk drive operates as a logical unit. Ten logical units, identified as LUN 0 through LUN 9, are illustrated. The LUN configurations shown in FIGS. 5 through 8 need not be employed exclusively, e.g., the two disk drive ranks shown in FIGS. 5 through 8 may be configured into both a sub-LUN formed from analogous sections of drives D00 through D04, and a super-LUN formed by combining the remaining capacity of RANK 0 with RANK 1.

The logical configuration of the disk array is contained in several tables, saved within the disk configuration areas, which are utilized by the host system and array controller to store and retrieve data in the manner specified by the system user. The structure of each logical unit is described within a logical unit information block, containing information such as the RAID level scheme employed by the LUN, LUN block size, LUN segment size and other parameters which are described below. The logical unit information block also includes pointers into one or more rank information blocks which describe the structures of the physical disk drive ranks. A set of disk information blocks describes the structures of all disk drives on all channels. A sample logical unit information block is shown in Table 1. Examples of rank information and disk information blocks are provided in Tables 2 and 3, respectively.

TABLE 1

Logical Unit Information Block (lun_info)

| Byte | Field |
| --- | --- |
| 0 | LUN number |
| 1 | LUN type |
| 2 | RAID level |
| 3 | number of ranks |
| 4–5 | LUN flags |
| 6 | LUN status |
| 7 | segment 0 size |
| 8–11 | LUN segment size |
| 12–15 | last LUN data block |
| 16–19 | LUN block size |
| 20–23 | start disk block |
| 24–27 | disk capacity |
| 28–31 | rank info |
| 32–35 | RAID |
| 36–39 | host info |
| 40–43 | reserved |
| 44–47 | LUN page info |
| 48–49 | reconstruction amount |
| 50 | reconstruction frequency |
| 51 | reserved |

In the logical unit information block, the LUN number field identifies the LUN. The LUN type field defines the type of LUN. For example, a value of 0 for this field indicates a regular LUN, occupying all the available space on the drives; a value of 1 indicates a sub-LUN, which occupies a portion of space on the drives; and a value of 2 indicates a super-LUN which spans multiple physical ranks. The RAID level field indicates the type of RAID level used with the LUN, such as 0, 1, 3 or 5. The number of ranks field indicates the number of ranks used in by the LUN. The LUN flags field is used to define command and operation options for the LUN. The LUN status field is used to indicate the current status of the LUN. The LUN may not be accessed until start of day procedures are completed. The segment 0 size field indicates the number of blocks allocated for segment 0. This field is included since the optimal segment size for accessing the first few blocks on a LUN may be different from the optimal segment size for accessing all other blocks within the LUN. LUN segment size is the number of logical blocks grouped together on a single disk. The last LUN data block and LUN block size fields specify the data capacity and logical block size for host transfers. The starting disk block for the LUN and the number of disk blocks contained in each drive within the LUN are specified in the start disk block and disk capacity fields, respectively. The rank_info field contains pointers to rank information blocks for all ranks contained in the LUN. A sample rank information block follows.

TABLE 2

Rank Information Block (rank_info)

| Byte | Field |
| --- | --- |
| 0 | rank number |
| 1 | disks/rank |
| 2 | status |
| 3 | bad disk |
| 4–23 | disk info |
| 24–27 | logical blocks in rank |
| 28–31 | start logical block |
| 32–35 | end logical block |
| 36–39 | segments in rank |
| 40–43 | start segment |
| 44–47 | end segment |
| 48–51 | parity groups in rank |
| 52–55 | start group |
| 56–59 | end group |
| 60–63 | start disk sector |

The rank information block describes the structure of a rank. Within the rank information block, the disks/rank field indicates the number of disks contained in the rank. The disk _info field includes pointers to the set of disk information blocks which describe the individual disk drives employed in the LUN. Information concerning rank capacity, rank start logical block, number of segments in the rank, start and end segments for the rank, number of parity groups within the rank, start and end parity groups, and rank start disk sector are stored at byte offsets 24 through 63 within he rank information block. A sample disk information block follows.

TABLE 3

Disk Information Block (disk_info)

| Byte | Field |
| --- | --- |
| 0 | channel |
| 1 | disk id |
| 2 | disk LUN |
| 3 | start of day status |
| 4 | drive status |
| 5 | firmware version |
| 6 | disk option flags |
| 7 | reserved |
| 8–9 | disk sector size |
| 10–12 | sectors/track |
| 12–13 | ECC sector size |
| 14–17 | start data sector |
| 18–21 | end data sector |
| 22–25 | start maintenance sector |
| 26–29 | end maintenance sector |
| 30–33 | end disk sector |
| 34–37 | associated LUNs |
| 38–41 | drive object |

Each drive within the array is uniquely identified by a disk information block, such as the block shown above.

The disk array is configured using two Mode Select pages, tables that define the physical and logical aspects of the array. The fields contained in the disk, rank and LUN information blocks described above are derived from these two Mode Select pages. Each of these two pages, designated the physical array page and the logical array page, contain key parameters essential to the successful operation of the array. The physical array page controls all the physical aspects of the array without regard for its logical organization. Table 4, which follows, shows the organization of a physical array page for an array having a maximum of 240 drive positions.

TABLE 4

Physical Array Page

| Byte | MODE SELECT Layout | MODE SENSE Layout |
| --- | --- | --- |
| 0 | Page code 2A | Page code 2A |
| 1 | Page length (240 dec) | Page length (240 dec) |
| 2–241 | Drive status | Drive status |

The physical array page includes a one-byte status for each possible channel and ID position connected to the disk array controller. Each byte contains specific status values for a unique drive in the array. Status information for each drive may include an optimal status if the drive is operating correctly or a reconstruction status if a drive has been replaced and an array reconstruction is in process. During Mode Select operations, the host can add, delete or modify information concerning physical aspects of the array. During Mode Sense operations, current information is reported.

The logical array page controls the logical organization of the disk array. Parameters include the RAID level of the logical unit, the logical unit segment size, the reconstruction frequency and the reconstruction amount. Table 5 provides an example logical array page.

TABLE 5

Logical Array Page

| Byte | MODE SELECT Layout | MODE SENSE Layout |
| --- | --- | --- |
| 0 | Page code 2B | Page code 2B |
| 1 | Page length (130 dec) | Page length (130 dec) |
| 2 | Action to take | LUN status |
| 3 | RAID level | RAID level |
| 4 | LUN type | LUN type |
| 5–8 | LUN block size | LUN block size |
| 9–10 | Reserved | Drive sector size |
| 11–14 | Reserved | LUN number of blocks |
| 15–18 | Reserved | Reserved |
| 19–22 | LUN segment size | LUN segment size |
| 23 | LUN segment 0 size | LUN segment 0 size |
| 24–25 | LUN flags | LUN flags |
| 26–29 | Reserved | Reconstruction block completed |
| 30 | Reconstruction frequency | Reconstruction frequency |
| 31–32 | Reconstruction amount | Reconstruction amount |
| 33–35 | Reserved | Reserved |
| 36–67 | Disk bit map | Disk bit map |
| 68–131 | Configuration table | Configuration table |

The RAID level of a specific logical unit is controlled by byte offset 3. The type of LUN, either a regular LUN such as is shown in FIG. 5, a super-LUN, as shown in FIG. 6, or a sub-LUN, as shown in FIG. 7, is specified by byte offset 4. LUN block size, LUN segment size and LUN segment 0 size were each discussed above in connection with table 1. The reconstruction frequency and reconstruction amount, specified at byte offsets 30 and 31–32, respectively, determine how fast the array is reconstructed in the event of a single drive failure. The disk bit map at byte offsets 36–67 identifies the physical drives that are used in the LUN. The configuration table at byte offsets 68–131 determines the order of data striping across the drives or, in the case of RAID 1, which drives will be mirrored pairs.

Mode Select operations allow the host to add, delete, modify or replace a LUN. The current definition of a LUN is reported through Mode Sense operations.

The employment of the information blocks and array tables to structure user-defined logical units will be readily understood by one skilled in the art upon review of the detailed description of the invention. It can thus be seen that there has been provided by the present invention an improved method for partitioning a disk array, a method whereby more than one RAID level can be supported by the disk array concurrently, wherein a single set of disk drives can be partitioned into multiple logical units, or wherein multiple sets of drives may be combined together to form a single logical unit operating as a single set of drives.

Although the presently preferred embodiment of the invention has been described, it will be understood that various changes may be made within the scope of the appended claims.

What is claimed is:

1. A method for storing data within a plurality of disk drives; comprising the steps of:

partitioning at least one of said plurality of disk drives into multiple partitions;

configuring at least some of said partitions within said plurality of disk drives into at least two groups; and configuring said groups into a logical disk array;

wherein each group within said logical disk array operates as a single disk drive within said logical disk array; data is stored within at least one of said groups in accordance with a disk array storage scheme; and data is stored within another of said groups in accordance with a different disk array storage scheme.

2. The method of claim 1, wherein at least one unpartitioned drive is also configured into one of said groups.

3. The method of claim 1 wherein the disk array storage scheme is a RAID storage scheme.

4. A method for storing data within a plurality of disk drives; comprising the steps of:

partitioning each one of said plurality of disk drives into multiple partitions, wherein each of said partitioned disk drives is partitioned into an equivalent number of partitions, and wherein corresponding partitions from said partitioned disk drives have equivalent storage capacity; and configuring corresponding partitions from said plurality of disk drives into a logical disk array;

wherein each partition within said logical disk array operates as a single disk drive within said logical disk array; data is stored within at least one of said partitions in accordance with a disk array storage scheme; and data is stored within another of said partitions in accordance with a different disk array storage scheme.

5. A method for storing data within a plurality of disk drives; comprising the steps of:

partitioning each one of said plurality of disk drives into at least two partitions, wherein each one of said plurality of disk drives is partitioned into an equivalent number of partitions, and wherein corresponding partitions from said disk drives have equivalent storage capacity in an equivalent manner; and configuring said partitions into at least two logical units, each one of said logical units including corresponding partitions from each one of said plurality of disk drives;

wherein each one of said logical units functions as an independent disk array; and each partition within each one of said logical units operates as a single disk drive within its logical unit; and wherein data is stored within each one of said logical units in accordance with a different disk array storage scheme.

6. A method for storing data within a plurality of disk drives; comprising the steps of:

grouping said disk drives into at least two groups, each group comprising at least two disk drives; and configuring said groups into a single logical unit; wherein:

said logical unit operates as a disk array;

each group within said logical unit operates as a single disk drive within said logical unit;

said groups are organized into at least two logical units;

data is stored within at least one of said logical units in accordance with a RAID storage scheme; and data is stored within another of said logical units in accordance with a different RAID storage scheme.

7. A method for storing data within a disk array including a plurality of disk drives distributed across a plurality of channels and organized into at least one rank, said rank including a set of corresponding disk drives, one drive from each channel, the method comprising the steps of:

partitioning each drive within said rank into at least two partitions, each drive within said rank being partitioned into an equivalent number of partitions, corresponding partitions from said disk drives having equivalent storage capacity;

configuring each set of corresponding partions from the disk drives within said rank into a corresponding logical unit; and operating each logical unit in accordance with a different disk array storage scheme;

each partition within each one of said logical units operates as a single disk drive within its logical unit.

8. A method for storing data within a disk array including a plurality of disk drives distributed across a plurality of channels and organized into at least two ranks, each one of said ranks including a set of corresponding disk drives, one drive from each channel, the method comprising the steps of:

associating each disk drive belonging to a first rank with a corresponding disk drive belonging to a second rank;

operating each pair of associated disk drives as a single disk drive;

operating said first and second ranks as a logical disk array;

wherein each pair of disk drives operates as a single disk drive within said logical disk array;

storing data within a first single disk drive in accordance with a RAID storage scheme; and storing data within a second single disk drive in accordance with another RAID storage scheme.

* * * * *